US007019382B2

(12) United States Patent
Litwin et al.

(10) Patent No.: US 7,019,382 B2
(45) Date of Patent: Mar. 28, 2006

(54) ARRANGEMENT FOR ESD PROTECTION OF AN INTEGRATED CIRCUIT

(75) Inventors: Andrej Litwin, Danderyd (SE); Ola Pettersson, Järfälla (SE)

(73) Assignee: Infineon Technologies AG, Munich (DE)

( * ) Notice: Subject to any disclaimer, the term of this patent is extended or adjusted under 35 U.S.C. 154(b) by 1 day.

(21) Appl. No.: 10/791,389

(22) Filed: Mar. 2, 2004

(65) Prior Publication Data

US 2004/0164355 A1 Aug. 26, 2004

Related U.S. Application Data

(63) Continuation of application No. PCT/SE02/01535, filed on Aug. 28, 2002.

(30) Foreign Application Priority Data

Sep. 6, 2001 (SE) .............................................. 0102960

(51) Int. Cl.
*H01L 29/00* (2006.01)

(52) U.S. Cl. ........................................ 257/546; 257/528

(58) Field of Classification Search ................. 257/546, 257/547, 548
See application file for complete search history.

(56) References Cited

U.S. PATENT DOCUMENTS 4,710,791 A 12/1987 Shirato et al. ........... 357/23.13
4,730,208 A 3/1988 Sugino et al. ............. 357/23.8
4,806,999 A 2/1989 Strauss .................... 357/23.13
4,876,584 A 10/1989 Taylor ...................... 357/23.13
5,124,578 A 6/1992 Worley et al. .............. 306/443
5,196,913 A 3/1993 Kim et al. ............... 357/23.13
5,406,105 A 4/1995 Lee ............................ 257/335
5,615,073 A 3/1997 Fried et al. .................... 361/56
5,751,507 A 5/1998 Watt et al. ..................... 361/56
5,803,343 A 9/1998 Sarma et al. ............... 257/358
6,037,636 A 3/2000 Crippen ...................... 257/355
6,292,046 B1 9/2001 Ali ............................. 327/310
6,331,726 B1 12/2001 Voldman .................... 257/541
6,432,282 B1 * 8/2002 Shamouilian et al. .... 204/228.1
6,455,919 B1 * 9/2002 Brennan et al. ............ 257/616
6,496,341 B1 12/2002 Chen et al. .................... 361/56

FOREIGN PATENT DOCUMENTS

EP 0 371 663 A1 11/1989
JP 401199403 * 8/1989
WO WO 01/18965 A1 3/2001

* cited by examiner

*Primary Examiner*—Douglas A. Wille
(74) *Attorney, Agent, or Firm*—Baker Botts L.L.P.

(57) ABSTRACT

To protect a high-frequency integrated circuit (1) against higher voltages than normal operating voltages on an input/output terminal connected to a bonding pad (2), a semiconductor varistor (3) having low and essentially constant resistance for said normal operating voltages and higher resistance for said higher voltages is integrated between the bonding pad (2) and the input/output terminal together with the integrated circuit (1).

12 Claims, 1 Drawing Sheet

ARRANGEMENT FOR ESD PROTECTION OF AN INTEGRATED CIRCUIT

CROSS REFERENCE TO RELATED APPLICATION

This application is a continuation of copending International Application No. PCT/SE02/01535 filed Aug. 28, 2002 which designates the United States, and claims priority to Swedish application no. 0102960-2 filed Sep. 6, 2001.

1. Technical Field of the Invention

The present invention relates generally to integrated circuits and more specifically to electrostatic discharge protection of integrated circuits.

2. Background of the Invention

Electrostatic discharges (ESDs) may, as is well known, damage electronic devices, particularly electronic semiconductor devices fabricated on conducting, semiconducting, insulating or semiinsulating substrates, such as integrated circuits.

Devices for ESD protection are conventionally incorporated in input/output paths of most semiconductor devices in order to shunt excessive charge away from the sensitive circuits.

In input paths of semiconductor devices, often some protection against high input currents is provided, such as an electrical resistance connected in the input path, this resistance limiting the input current. This resistance is conventionally located outside the bonding pad.

For high frequency applications at GHz frequencies, however, a resistance creates several problems. The R×C product of the resistance and the input capacitance of the circuit sets the limit of the highest operation frequency. Furthermore, the resistance itself creates noise, which is deleterious in low noise applications.

SUMMARY OF THE INVENTION

The object of the invention is to provide a device for protecting a high frequency integrated circuit against excessive positive and/or negative voltages, such as ESDs, without having to add extra processing steps when fabricating the integrated circuit.

This is attained in accordance with the invention by an arrangement for protecting a high-frequency integrated circuit against higher voltages than normal operating voltages on an input/output terminal connected to a bonding pad in that the arrangement comprises a semiconductor varistor that is produced between the bonding pad and the input/output terminal of an integrated circuit in one and the same process on one and the same die and that has low essentially constant resistance for said normal operating voltages and higher resistance for said higher voltages.

BRIEF DESCRIPTION OF THE DRAWING

The invention will be described more in detail below with reference to the appended drawing on which

DESCRIPTION OF THE INVENTION

In accordance with the invention, a silicon integrated varistor is used as a current limiting component in an arrangement for ESD protection of a silicon integrated circuit for high frequency applications.

It should be pointed out that varistors can be designed in a number of ways for this purpose, where different physical phenomena can be utilized. The simplest way to achieve the desired effect is to use the fact that the velocity of electric carriers, i.e. electrons and holes, saturates with increasing strength of an electric field. It follows that the current through the varistor saturates even if the voltage across the varistor continues to increase.

Figure 1:
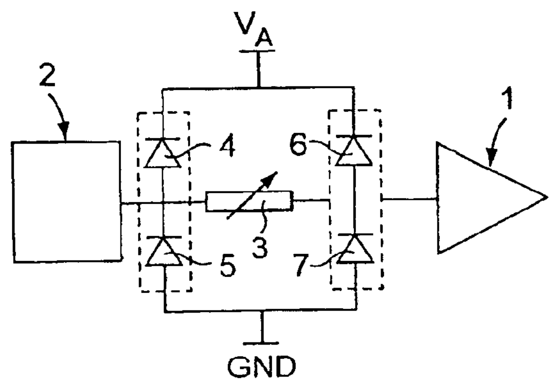
FIG. 1 illustrates an embodiment of an arrangement according to the invention for protecting an input amplifier of an integrated circuit against ESDs by means of a varistor.

FIG. 1 illustrates an embodiment of an arrangement according to the invention for protecting an input amplifier 1 of an integrated circuit (not further shown) against ESDs appearing on an input terminal of the amplifier 1 that is connected to a bonding pad 2.

In accordance with the invention, a varistor 3 is integrated between the input terminal of the amplifier 1 and the bonding pad 2 in order to limit any appearing ESD current.

In a manner known per se in connection with ESD current limiting high-resistance resistors, the interconnection point between the varistor 3 and the bonding pad 2 is connected to a so-called primary current shunting device.

In the embodiment shown in FIG. 1, the primary current shunting device comprises a diode 4 that is connected with its anode to the interconnection point between the varistor 3 and the bonding pad 2 and with its cathode to a positive voltage $V_A$, and a diode 5 that is connected with its cathode to the interconnection point between the varistor 3 and the bonding pad 2 and with its anode to ground GND.

The interconnection point between the varistor 3 and the input terminal of the amplifier 1 can be connected to a so-called secondary current shunting device that, however, also can be omitted.

In the embodiment shown in FIG. 1, the secondary current shunting device comprises a diode 6 that is connected with its anode to the interconnection point between the varistor 3 and the amplifier 1 and with its cathode to the positive voltage $V_A$, and a diode 7 that is connected with its cathode to the interconnection point between the varistor 3 and the amplifier 1 and with its anode to ground GND.

The primary and secondary current shunting devices shunt any appearing ESD current to $V_A$ or ground GND.

It is to be understood that other current shunting devices can be utilized, e.g. thyristor diodes.

In accordance with the invention, the varistor 3 is designed to have low and essentially constant resistance within a range of normal operating voltages of the amplifier 1 and higher resistance for higher voltages than the normal operating voltages.

Figure 2:
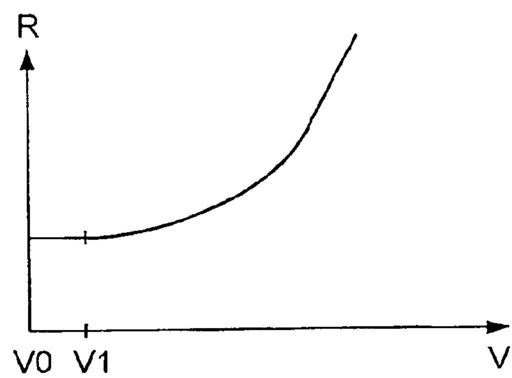
FIG. 2 is a resistance versus voltage diagram of the varistor in FIG. 1.

An exemplary resistance R versus voltage V diagram of the varistor 3 is shown in FIG. 2. As indicated in the diagram in FIG. 2, the resistance R of the varistor is supposed to be low and essentially constant for operating voltages between V0 and VI.

Figure 3:
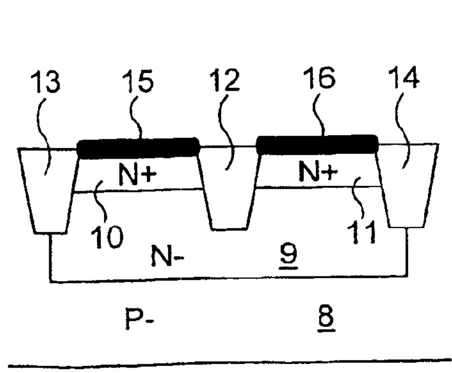
FIG. 3 illustrates a first embodiment of a varistor to be used in FIG. 1.

FIG. 3 shows a first embodiment of the varistor 3 in FIG. 1 that can be used for ESD protection in accordance with the invention.

The embodiment of the varistor in FIG. 3 has been produced in a P-substrate 8, e.g. comprising boron, into which an N− well 9, e.g. comprising phosphorous, has been diffused from the top of the substrate 8. Two N+ regions 10, 11 have been implanted into the N− well 9 from the top of the substrate 8. The N+ regions 10, 11 are separated by an isolator 12 that extends into the N− well 9. Isolators 13, 14 that also extend into the N− well 9 are provided on the other side of the respective N+ region 10 and 11. The isolators 12, 13 and 14 comprise e.g. field oxide or shallow trench isolation.

To connect the varistor in FIG. 3 to the amplifier 1 and the bonding pad 2 as illustrated in FIG. 1, contacts 15 and 16 are provided on top of the respective N+ region 10 and 11. The contacts 15, 16 comprise e.g. $TiSi_2$ or $CoSi_2$. The bottom side of the substrate 8 is normally grounded.

For normal operating voltages V0–V1 of the amplifier 1 in FIG. 1, the resistance is low and essentially constant between the contacts 15 and 16 of the varistor in FIG. 3 as illustrated by the diagram in FIG. 2. Current will flow from the N+ region 10 via the N− region 9 to the N+ region 11.

When the potential difference between the contacts 15 and 16 of the varistor in FIG. 3 increases above the normal operating voltages of the amplifier 1 in FIG. 1 such as when an ESD appears, i.e. when the electric field between the N+ regions 10 and 11 increases above the normal electric field between the N+ regions 10 and 11, the velocity of electric carriers, in this case electrons, between the N+ regions 10 and 11 will become saturated. Thus, the current through the varistor in FIG. 3 will become saturated even if the electric field continues to increase. In other words, the resistance will increase with increasing voltage across the varistor in FIG. 3, i.e. voltages>V1, as illustrated by the diagram in FIG. 2.

The doping level of the N− well 9 and the dimensions of the isolator 12 are chosen such as to fulfil the electrical characteristics in the diagram in FIG. 2. If not carefully chosen, the described device will behave as a resistor or will have characteristics that are unsuitable for a protective device.

Figure 4:
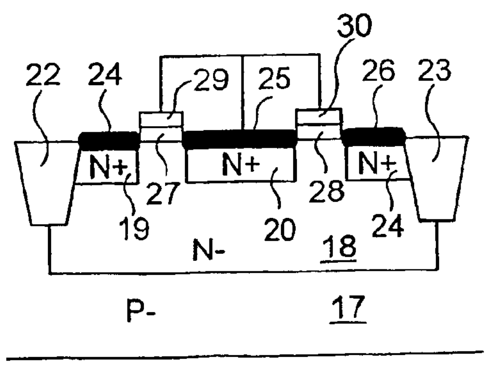
FIG. 4 illustrates a second embodiment of a varistor to be used in FIG. 1.

FIG. 4 shows a second embodiment of the varistor 3 in FIG. 1 that can be used for ESD protection in accordance with the invention.

The embodiment of the varistor in FIG. 4 has been produced in a P-substrate 17, e.g. comprising boron, into which an N− well 18, e.g. comprising phosphorous, has been diffused from the top of the substrate 17. Three separate N+ regions 19, 20 and 21 have been implanted into the N− well 18 from the top of the substrate 17 between two isolators 22, 23 that extend into the N− well. The isolators 22, 23 comprise e.g. field oxide or shallow trench isolation.

Contacts 24, 25 and 26 are provided on top of the respective N+ region 19, 20 and 21. The contacts 24, 25 and 26 comprise e.g. $TiSi_2$ or $CoSi_2$. The bottom side of the substrate 17 is normally grounded.

The contacts 24 and 26 that are located next to the isolators 22 and 23 of the varistor in FIG. 4 are to be connected to the amplifier 1 and the bonding pad 2 as illustrated in FIG. 1.

Isolating layers 27, 28, e.g. comprising $SiO_2$, are provided between the contacts 24, 25 and 25, 26, respectively. Gates 29, 30, e.g. of polysilicon, are provided on top of these isolating layers 27, 28. These gates 29, 30 are interconnected with the contact 25 on top of the N+ region 20.

For normal operating voltages of the amplifier 1 in FIG. 1, the resistance is constant between the contacts 24 and 26 of the varistor in FIG. 4 as illustrated by the diagram in FIG. 2. Current will flow from N+ region 19 to N+ region 20 and from N+ region 20 to N+ region 21.

In case of a positive ESD voltage appearing on e.g. contact 24, the potential of the contact 24 will be higher than the potential of the contact 25, i.e. of the gates 29 and 30.

This causes the N− region under the gate 29 to become depleted of electrons starting from the contact 24. Hereby, the resistance between the N+ regions 19 and 20 will increase. However, in the N− region under the gate 30, electrons will accumulate.

Besides the resistance increase caused by the depletion of electrons under the gate 29, the velocity of electric carriers, in this case electrons, between the N+ regions in the varistor in FIG. 4 will become saturated when the electric field between the N+ regions increases above the normal electric field between the N+ regions. Thus, the current through the varistor in FIG. 4 will also become saturated even if the electric field continues to increase. In other words, the resistance will increase with increasing voltage across the varistor in FIG. 4 as illustrated by the diagram in FIG. 2.

It should be obvious to anyone skilled in the art that similar types of varistors such as varistors based on JFETs or MESFETs or combinations thereof (also combinations with the varistors described above) can be used for ESD protection in accordance with the invention.

We claim:

1. An arrangement for protecting a high-frequency integrated circuit against higher voltages than normal operating voltages on an input/output terminal connected to a bonding pad, wherein the arrangement comprises a semiconductor varistor that is integrated between the bonding pad and the input/output terminal together with the integrated circuit and that has a low resistance for said normal operating voltages and a higher resistance for said higher voltages.

2. The arrangement according to claim 1, wherein the resistance for said normal operating voltages is essentially constant.

3. The arrangement according to claim 1, wherein an interconnection point between the varistor and the bonding pad is connected to a primary current shunting device.

4. The arrangement according to claim 3, wherein the primary current shunting device comprises a diode that is connected with its anode to the interconnection point between the varistor and the bonding pad and with its cathode to a positive voltage, and a diode that is connected with its cathode to the interconnection point between the varistor and the bonding pad and with its anode to ground.

5. The arrangement according to claim 1, wherein the interconnection point between the varistor and the integrated circuit is connected to a secondary current shunting device.

6. The arrangement according to claim 5, wherein the secondary current shunting device comprises a diode that is connected with its anode to the interconnection point between the varistor and the integrated circuit and with its cathode to a positive voltage, and a diode that is connected with its cathode to the interconnection point between the varistor and the integrated circuit and with its anode to ground.

7. A protection arrangement comprising:

a high-frequency integrated circuit comprising an input/output terminal and a bonding pad, a semiconductor varistor integrated between the bonding pad and the input/output terminal together with the integrated circuit which has a low resistance for a normal operating voltages and a higher resistance for higher voltages.

8. The arrangement according to claim 7, wherein the resistance for said normal operating voltages is essentially constant.

9. The arrangement according to claim 7, wherein an interconnection point between the varistor and the bonding pad is connected to a primary current shunting device.

10. The arrangement according to claim 9, wherein the primary current shunting device comprises a diode that is connected with its anode to the interconnection point between the varistor and the bonding pad and with its cathode to a positive voltage, and a diode that is connected with its cathode to the interconnection point between the varistor and the bonding pad and with its anode to ground.

11. The arrangement according to claim 9, wherein the interconnection point between the varistor and the integrated circuit is connected to a secondary current shunting device.

12. The arrangement according to claim 11, wherein the secondary current shunting device comprises a diode that is connected with its anode to the interconnection point between the varistor and the integrated circuit and with its cathode to a positive voltage, and a diode that is connected with its cathode to the interconnection point between the varistor and the integrated circuit and with its anode to ground.

* * * * *